(12) United States Patent
Lin et al.

(10) Patent No.: US 12,707,695 B2
(45) Date of Patent: Aug. 11, 2026

(54) SEMICONDUCTOR DEVICE AND METHOD FOR FORMING THE SAME

(71) Applicant: Powerchip Semiconductor Manufacturing Corporation, Hsinchu (TW)

(72) Inventors: Meng-Han Lin, Hsinchu City (TW); Yu-Chang Lin, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 370 days.

(21) Appl. No.: 18/613,149

(22) Filed: Mar. 22, 2024

(65) Prior Publication Data

US 2025/0253155 A1 Aug. 7, 2025

(30) Foreign Application Priority Data

Feb. 7, 2024 (TW) ................................ 113105019

(51) Int. Cl.
*H10D 64/62* (2025.01)
*H10D 64/01* (2025.01)

(52) U.S. Cl.
CPC ......... *H10D 64/0112* (2026.01); *H10D 64/62* (2025.01)

(58) Field of Classification Search
CPC .............. H01L 21/28518; H10D 64/62; H10D 64/0112
See application file for complete search history.

(56) References Cited

U.S. PATENT DOCUMENTS

| | | | |
|---|---|---|---|
| 9,136,404 | B2 | 9/2015 | Lee et al. |
| 10,043,880 | B2 | 8/2018 | Pore et al. |
| 10,373,872 | B2 | 8/2019 | Hsiao et al. |
| 10,468,410 | B2 | 11/2019 | Lin et al. |
| 10,510,855 | B2 | 12/2019 | Lin et al. |
| 11,239,313 | B2 | 2/2022 | Lin et al. |
| 11,373,872 | B2 | 6/2022 | Ji et al. |

(Continued)

FOREIGN PATENT DOCUMENTS

| | | |
|---|---|---|
| TW | I757738 | 3/2022 |

OTHER PUBLICATIONS

"Notice of allowance of Taiwan Counterpart Application", issued on Oct. 30, 2024, p. 1-p. 4.

*Primary Examiner* — Dale E Page
*Assistant Examiner* — Wilner Jean Baptiste
(74) *Attorney, Agent, or Firm* — JCIPRNET

(57) ABSTRACT

The present disclosure provides a semiconductor device and a method for forming the same. The semiconductor device includes a substrate including an isolation structure defining an active region, a gate structure disposed on the active region of the substrate, a source and a drain respectively disposed in the substrate at opposite sides of the gate structure in a first direction, blocking patterns respectively disposed on the source and drain in which each source and drain including first regions covered by the blocking patterns and a second region exposed by the blocking patterns, and first and second silicide layers respectively embedded in the second regions of the source and drain and each including first portions and a second portion between the first portions. A length of the first portion in the first direction is smaller than that of the second portion.

10 Claims, 5 Drawing Sheets

(56) References Cited

U.S. PATENT DOCUMENTS 11,996,364 B2 * 5/2024 Lee ...................... H10D 30/673
2016/0211136 A1 7/2016 LaRoche et al.
2023/0009077 A1 * 1/2023 Liang ................. H10D 64/0112

* cited by examiner

SEMICONDUCTOR DEVICE AND METHOD FOR FORMING THE SAME

CROSS-REFERENCE TO RELATED APPLICATION

This application claims the priority benefit of Taiwan application serial no. 113105019, filed on Feb. 7, 2024. The entirety of the above-mentioned patent application is hereby incorporated by reference herein and made a part of this specification.

BACKGROUND

Technical Field

The present invention relates to a semiconductor device and a method for forming the same.

Description of Related Art

Power semiconductor components such as power metal oxide semiconductor field effect transistors (MOSFETs) are commonly used in analog circuits and/or digital circuits, and it can be divided into planar power semiconductor components and vertical power semiconductor components according to the direction of the current flow. In the planar power semiconductor components, the horizontal areas and/or the channel lengths of the power semiconductor components are usually positively correlated with the operating voltages of the semiconductor components.

However, since the channel lengths and/or the operating voltages of the power semiconductor components are generally higher than that of the logic semiconductor components, the threshold voltages at the edges of the power semiconductor component in the width direction perpendicular to the extension direction of the channel are different from the threshold voltage at the center of the power semiconductor component in the width direction. As such, a double-hump phenomenon is occurred in the base current (e.g., the current flowing from the source to the drain, which makes model fitting difficult or generates an undesired amplifier behavior. Therefore, the skilled persons are still devoted to solve the impact of the double-hump phenomenon on the power semiconductor components.

SUMMARY

The invention provides a semiconductor device and a method for forming the same in which a first silicide layer and a second silicide layer respectively embedded in second regions of a source and a drain each includes a plurality of first portions and a second portion between the first portions, and lengths of the first portions in a first direction are smaller than a length of the second portion in the first direction. As such, the resistances at edges of the semiconductor device in a width direction perpendicular to an extension direction of a channel (i.e. the first direction) are increased, so that the threshold voltage of the semiconductor device is mainly depended on the resistance at the center of the semiconductor device in the width direction, and thus a double-hump phenomenon is not occurred in the base current.

An embodiment of the present invention provides a method for forming a semiconductor device including: forming a gate stack structure on a substrate, wherein the substrate includes an active region defined by an isolation structure, and the gate stack structure is disposed in the active region; forming a source and a drain in the active region of the substrate, wherein the source and the drain are respectively formed at opposite sides of the gate stack structure in a first direction; forming a blocking layer on the source and the drain, wherein each of the source and the drain includes a plurality of first regions covered by the blocking layer and a second region exposed by the blocking layer; and performing a silicidation process to form a first silicide layer in the second region of the source and to form a second silicide layer in the second region of the drain. Each of the first silicide layer and the second silicide layer includes a plurality of first portions and a second portion between the first portions, and lengths of the first portions in the first direction are less than a length of the second portion in the first direction.

In some embodiments, the first silicide layer and the second silicide layer are spaced apart from each other at the second portion by a distance smaller than distances which the first silicide layer and the second silicide layer are spaced apart from each other at the first portions.

In some embodiments, the blocking layer includes a first blocking pattern and a second blocking pattern spaced apart from each other in a second direction crossing the first direction, and the first blocking pattern and the second blocking pattern cover a top surface and sidewalls of the gate stack structure.

In some embodiments, the method further includes: removing portions of the first blocking pattern and the second blocking pattern on the top surface of the gate stack structure to form a plurality patterns spaced apart from each other and respectively covering the first regions of the source and the drain.

In some embodiments, the first silicide layer is not formed in the first regions of the source, and the second silicide layer is not formed in the first regions of the drain.

An embodiment of the present invention provides a semiconductor device including a substrate, a gate structure, a source and a drain, a plurality of blocking patterns, and a first silicide layer and a second silicide layer. The substrate includes an isolation structure defining an active region. The gate structure is disposed on the active region of the substrate. The source and the drain are respectively disposed in the substrate at the opposite sides of the gate structure in the first direction. The blocking patterns are respectively disposed on the source and the drain. Each of the source and the drain includes a plurality of first regions covered by the blocking pattern and a second region exposed by the blocking pattern. The first silicide layer and the second silicide layer are respectively embedded in the second region of the source and the second region of the drain. Each of the first silicide layer and the second silicide layer includes a plurality of first portions and a second portion between the first portions. Lengths of the first portions in the first direction are less than a length of the second portion in the first direction.

In some embodiments, wherein a pattern of the first silicide layer and a pattern of the second silicide layer are mirror-symmetric in the first direction.

In some embodiments, the first silicide layer and the second silicide layer are spaced apart from each other at the second portion by a distance smaller than distances which the first silicide layer and the second silicide layer are spaced apart from each other at the first portions.

In some embodiments, each of the blocking patterns covers sidewalls of the gate structure.

In some embodiments, the first silicide layer is not formed in the first regions of the source, and the second silicide layer is not formed in the first regions of the drain.

Based on the above, in the aforementioned semiconductor device and the method for forming the same, the first silicide layer and the second silicide layer respectively embedded in the second regions of the source and the drain are each designed or formed to include a plurality of first portions and a second portion between the first portions in which lengths of the first portions in the first direction are smaller than a length of the second portion in the first direction. As such, the resistances at edges of the semiconductor device in a width direction perpendicular to an extension direction of a channel (i.e. the first direction) are increased, so that the threshold voltage of the semiconductor device is mainly depended on the resistance at the center of the semiconductor device in the width direction, and thus a double-hump phenomenon is not occurred in the base current.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
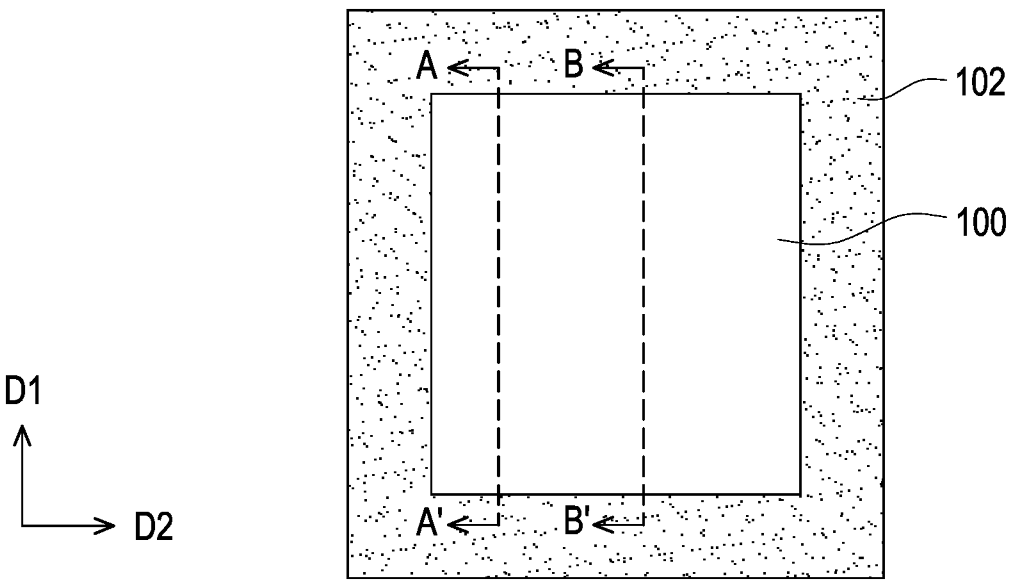
FIGS. 1A, 1B, 1C, 2A, 2B, 2C, 3A, 3B, 3C, 4A, 4B, 4C, 5A, 5B and 5C are schematic views illustrating a method for forming a semiconductor device in an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection).

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 3A:
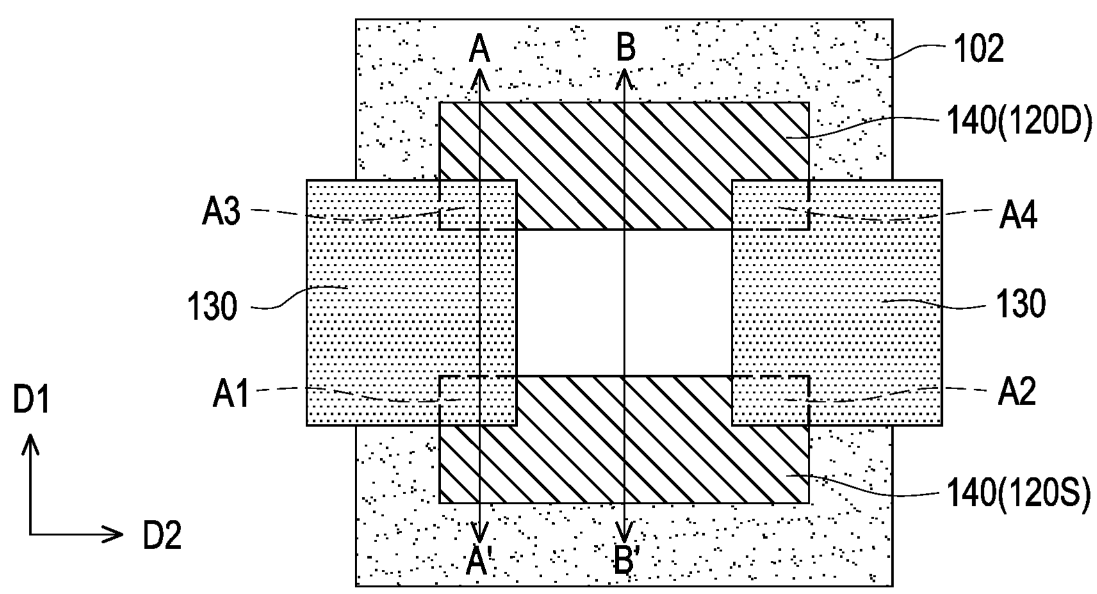
Figure 3B:
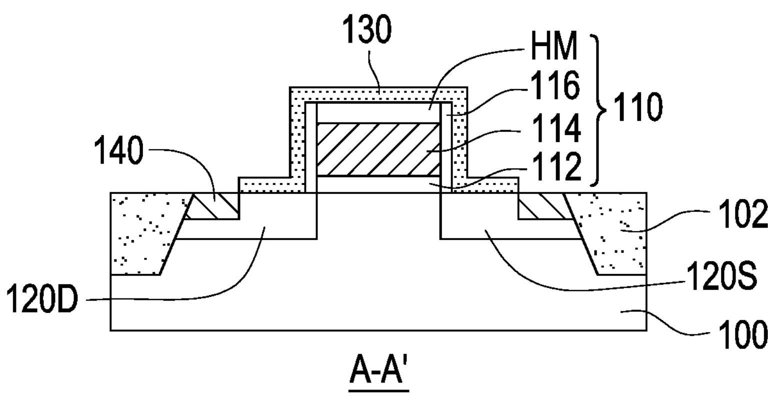
Figure 3C:
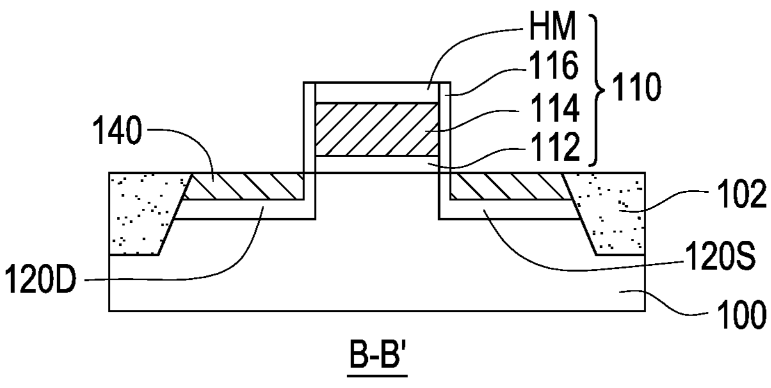
Figures 4A, 4B, 4C:
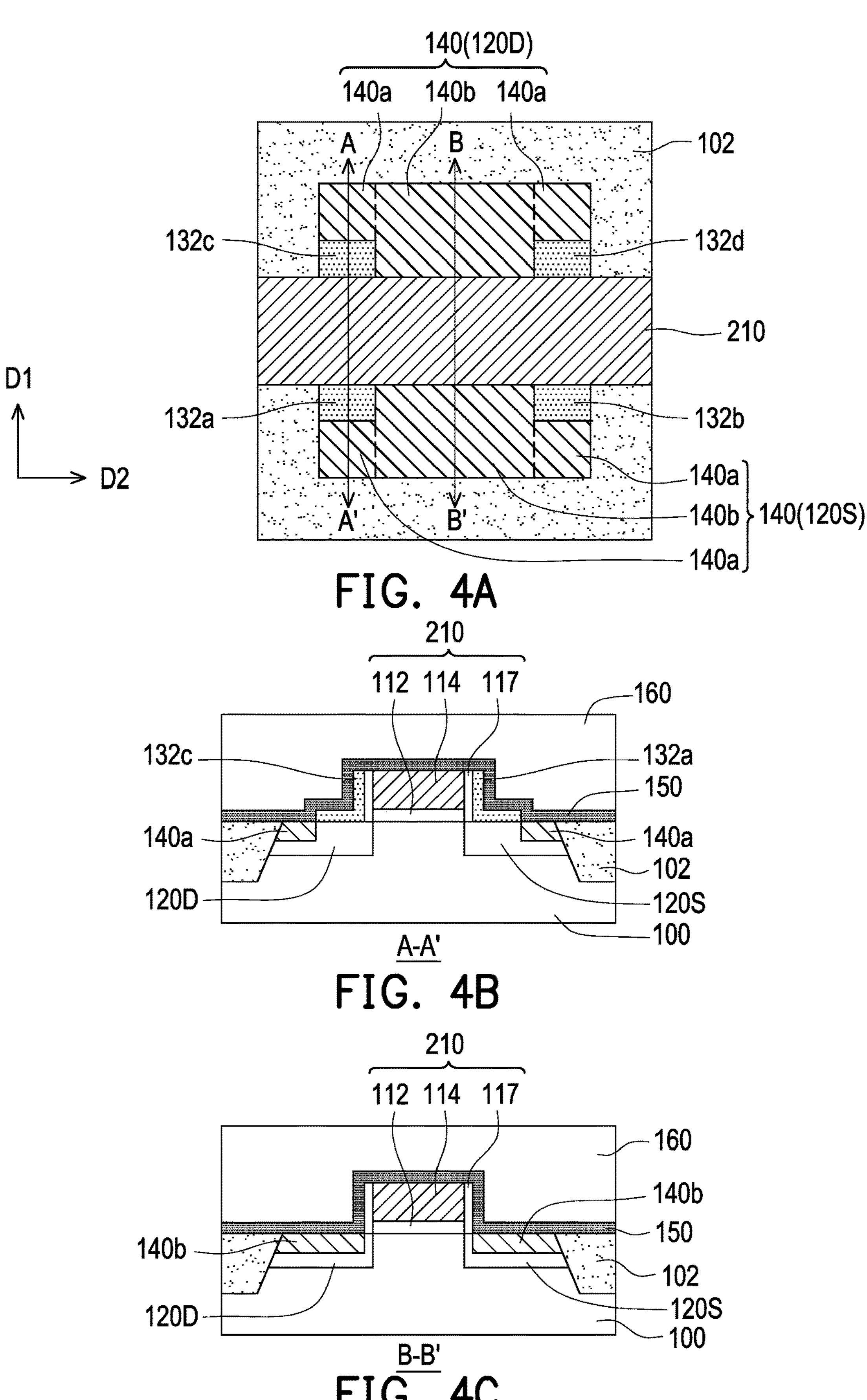
Figure 5A:
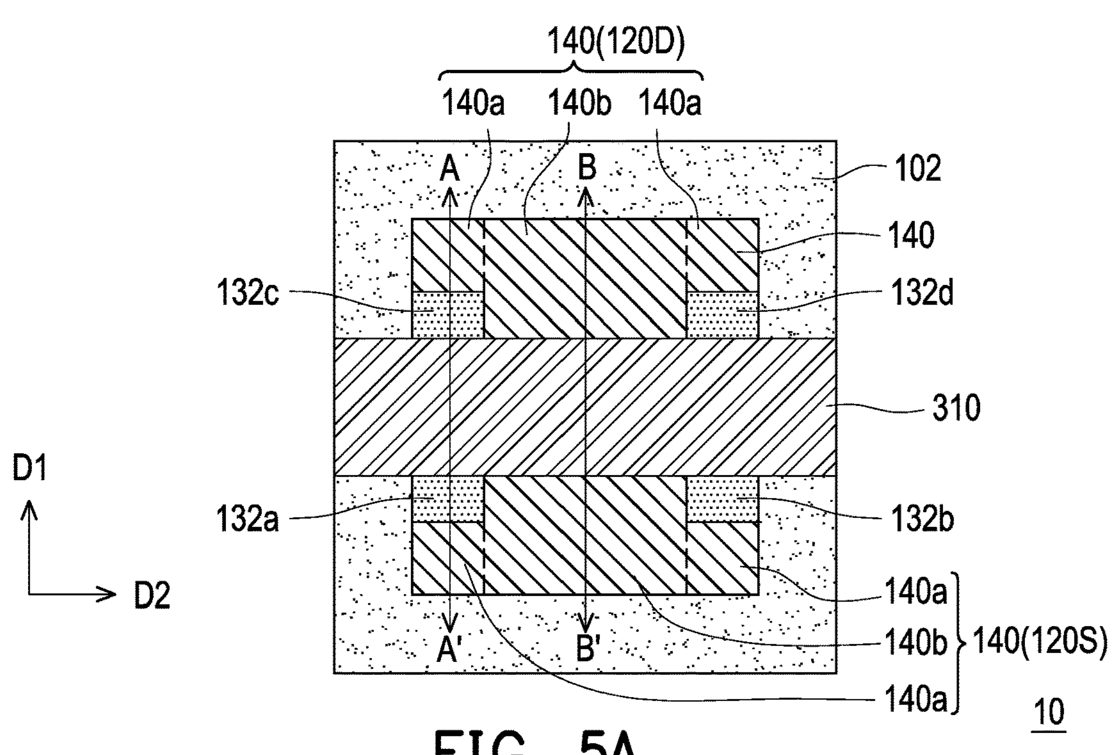
Figure 5B:
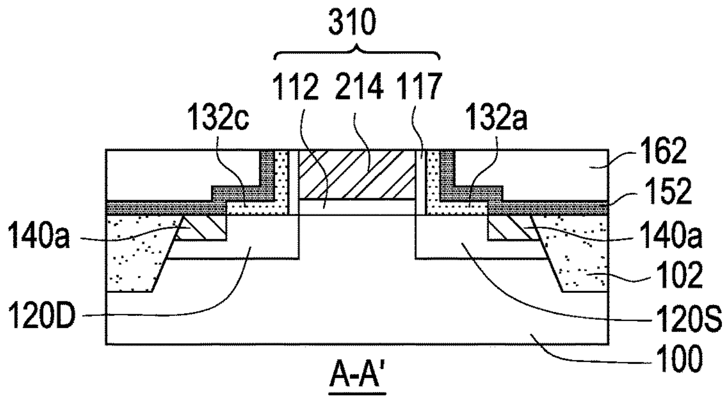
Figure 5C:
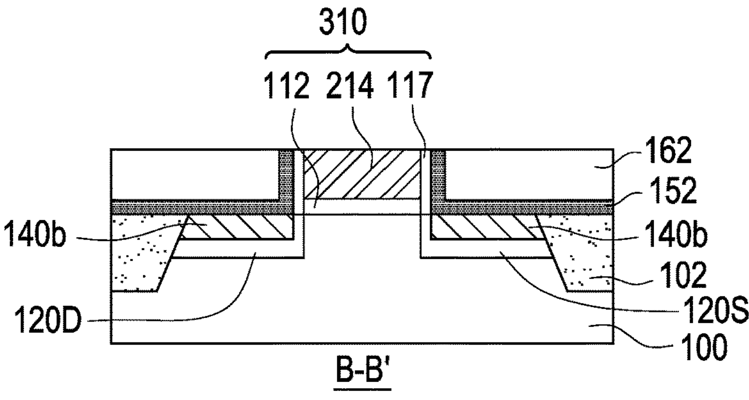

FIG. 1A to FIG. 5C are schematic views illustrating a method for forming a semiconductor device in an embodiment of the invention. FIGS. 1A, 2A, 3A, 4A and 5A are schematic top views illustrating a method for forming a semiconductor device in an embodiment of the invention. FIGS. 1B and 1C are schematic cross-sectional views respectively taken along from line AA' and line BB' of FIG. 1A. FIGS. 2B and 2C are schematic cross-sectional views respectively taken along from line AA' and line BB' of FIG. 2A. FIGS. 3B and 3C are schematic cross-sectional views respectively taken along from line AA' and line BB' of FIG. 3A. FIGS. 4B and 4C are schematic cross-sectional views respectively taken along from line AA' and line BB' of FIG. 4A. FIGS. 5B and 5C are schematic cross-sectional views respectively taken along from line AA' and line BB' of FIG. 5A. For convenience of explanation, the etching stop material layer 150 and the dielectric layer 162 are omitted in FIG. 4A, and the etching stop layer 152 and the dielectric layer 162 are omitted in FIG. 5A.

In some embodiments, a method for forming a semiconductor device (e.g., a semiconductor device 10 shown in FIG. 5A) may include following steps.

Figure 2A:
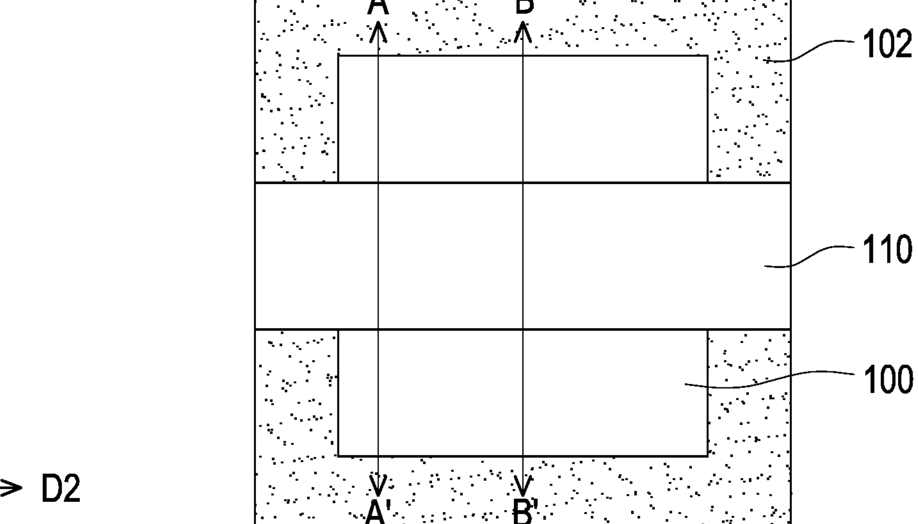
Figure 2B:
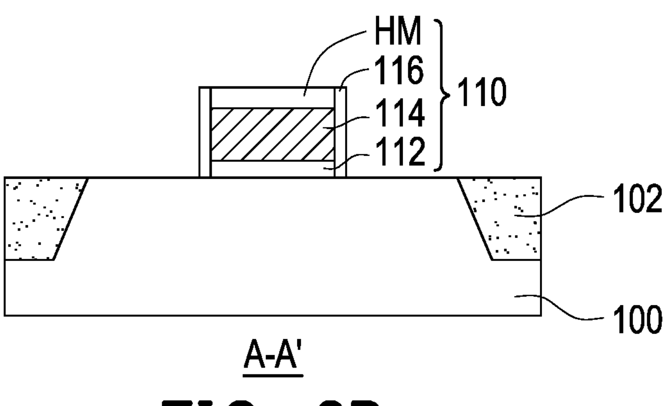
Figure 2C:
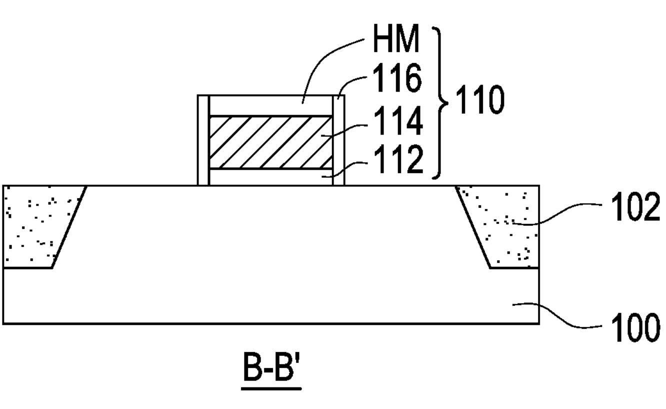

Firstly, a gate stack structure (e.g., a gate stack structure 110 shown in FIGS. 2A to 2C) is formed on a substrate (e.g., a substrate 100 shown in FIGS. 2A to 2C). In some embodiments, the gate stack structure may be formed on the substrate through the following steps.

Figure 1B:
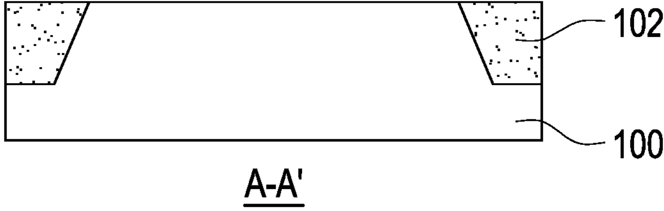
Figure 1C:
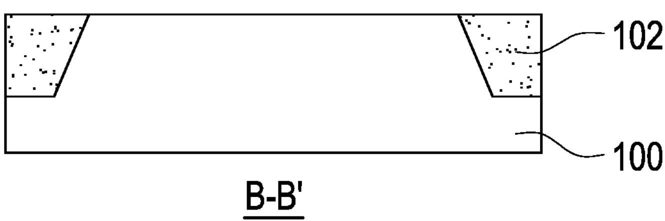

Referring to FIGS. 1A to 1C, an isolation structure 102 defining an active region is formed in the substrate 100. Then, a doping process is performed on the active region of the substrate 100 to form a well region. The substrate 100 may include a semiconductor substrate or a semiconductor-on-insulator (SOI) substrate. The semiconductor materials in the semiconductor substrate or in the SOI substrate may include an element semiconductor, an alloy semiconductor, or a compound semiconductor. For example, the element semiconductor may include Si or Ge. The alloy semiconductor may include SiGe, SiGeC, or the like. The compound semiconductor may include SiC, III-V semiconductor materials, or II-VI semiconductor materials. The III-V semiconductor materials may include GaN, GaP, GaAs, AlN, AlP, AlAs, InN, InP, InAs, GaNP, GaNAs, GaPAs, AlNP, AlNAs, AlPAS, InNP, InNAs, InPAs, GaAlNP, GaAlNAs, GaAlPAs, GaInNP, GaInNAs, GaInPAs, InAlNP, InAlNAs, or InAlPAs. The II-VI semiconductor materials may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. The semiconductor material may be doped with a dopant of a first conductivity type or a dopant of a second conductivity type complementary to the first conductivity type. For example, the first conductivity type may be n-type, whereas the second conductivity type may be p-type. The isolation structure 102 may include materials suitable for the isolation structure such as oxides (e.g., silicon oxides). In some embodiments, the isolation structure 102 may include a shallow trench isolation (STI) structure.

Referring to FIGS. 2A to 2C, a gate stack structure 110 is formed on the substrate 100. The gate stack structure 110 is disposed in the active region and includes a dielectric layer 112, a sacrificial gate layer 114 and a hard mask layer HM sequentially formed on the substrate 100 and spacers 116 formed on opposite sidewalls of a stacked structure constituted by the dielectric layer 112, the sacrificial gate layer 114 and the hard mask layer HM.

In some embodiments, the dielectric layer 112 may include a gate dielectric layer, a high dielectric constant (high-k) layer, and a capping layer sequentially formed on the substrate 100. The gate dielectric layer may include materials suitable for the gate dielectric layer, such as silicon oxide. The high-k layer may include a dielectric material having a high dielectric constant. For example, the dielectric material having the high dielectric constant may be a material having a dielectric constant higher than that of the silicon oxide (about 3.9). In some embodiments, the high-k layer may include $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, BaZrO, HfZrO, HfLaO, HfSiO, LaSiO, AlSiO, HfTaO, HfTiO, $Al_2O_3$, $Si_3N_4$, SiON or combinations thereof. The capping layer may include TiN.

In some embodiments, the sacrificial gate layer 114 may include polysilicon. In some embodiments, the hard mask layer HM may include oxides, nitrides, or combinations thereof. In some embodiments, the spacers 116 may include silicon oxides, silicon nitrides, or combinations thereof.

Next, referring to FIGS. 3A to 3C, a source 120S and a drain 120D are formed in the active region of substrate 100, the source 120S and the drain 120D are respectively formed at opposite sides of the gate stack structure 110 in a first direction D1. In some embodiments, the source 120S and the drain 120D may be formed in the substrate 100 at opposite sides of the gate stack structure 110 in the first direction D1 by performing a doping process on the active region of the substrate 100.

Then, a blocking layer 130 is formed on the source 120S and the drain 120D in which each of the source 120S and the drain 120D include a plurality of first regions (e.g., regions A1, A2, A3 and A4 shown in FIG. 3A) covered by the blocking layer 130 and second region exposed by the blocking layer 130 and where a silicide layer 140 is formed thereon in the subsequent processes. In some embodiments, the blocking layer 130 may be a layer that blocks silicides being formed thereon, which may also be referred to as the silicide blocking layer. The blocking layer 130 may include a material such as oxides suitable for the silicide blocking layer. In some embodiments, as shown in FIG. 3A, the blocking layer 130 includes a first blocking pattern (e.g., the left blocking layer 130 shown in FIG. 3A) and a second blocking pattern (e.g., the right blocking layer 130 shown in FIG. 3A) spaced apart from each other in a second direction D2 crossing the first direction D1 in which the first blocking pattern and the second blocking pattern cover the top surface and sidewalls of the gate stack structure 110. In some embodiments, the second direction D2 is perpendicular to the first direction D1.

After that, a silicidation process is performed to form the first silicide layer 140 in the second region of the source 120S and to form the second silicide layer 140 in the second region of the drain 120D. The first silicide layer 140 and the second silicide layer 140 may each include tungsten silicide, titanium silicide, cobalt silicide, zirconium silicide, platinum silicide, molybdenum silicide, copper silicide or nickel silicide, or combinations thereof. Since the first regions (e.g., regions A1 and A2) of the source 120S and the first regions (e.g., regions A3 and A4) of the drain 120D are covered by the blocking layer 130, the first silicide layer 140 is not formed in the regions A1 and A2 and the second silicide layer 140 is not formed in the regions A3 and A4 during the silicidation process. Namely, as shown in FIG. 4A, the first silicide layer 140 and the second silicide layer 140 are each formed to include a plurality of first portions 140*a* and second portions 140*b* between the first portions 140*a*, and lengths of the first portions 140*a* in the first direction D1 is smaller than a length of the second portion 140*b* in the first direction D1. As such, the regions A1 and A2 of the source 120S and the regions A3 and A4 of the drain 120D where the silicide layers 140 are not formed thereon have higher resistances as compared to the other regions where the silicide layers 140 are formed thereon, and therefore the resistances at edges of the semiconductor device in a width direction (i.e. the second direction D2) perpendicular to an extension direction (i.e. the first direction D1) of a channel are increased, so that the threshold voltage of the semiconductor device is mainly depended on the resistance at the center of the semiconductor device in the width direction (i.e., the center region where the line B-B' is passed), and thus the double-hump phenomenon is not occurred in the base current. In some embodiments, the first silicide layer 140 and the second silicide layer 140 are spaced apart from each other at the second portion 140*b* by a distance smaller than distances which the first silicide layer 140 and the second silicide layer 140 are spaced apart from each other at the first portions 140*a*.

Then, referring to FIGS. 3A to 3C and FIGS. 4A to 4C, portions of the blocking layer 130 on the top surface of the gate stack structure 110 and the hard mask layer HM of the gate stack structure 110 under the portions of the blocking layer 130 are removed to form a plurality of patterns (e.g., patterns 132*a*, 132*b*, 132*c* and 132*d*) spaced apart from each other and a sacrificial gate structure 210 in which the plurality of patterns are formed to cover the first regions (e.g., the regions A1 and A2) of the source 120S and the first regions (e.g., the regions A3 and A4) of the drain 120D, respectively. In some embodiments, in the step of removing the portions of the blocking layer 130 on the top surface of gate stack structure 110 and the hard mask layer HM of gate stack structure 110, portions of blocking layer 130 and spacers 116 located on the side surfaces of the hard mask layer HM are removed as well, so that the sacrificial gate structure 210 is formed to include spacers 117, and the blocking layer 130 is formed to include patterns 132*a*, 132*b*, 132*c* and 132*d* spaced apart from each other and covering sidewalls of the sacrificial gate structure 210. In some embodiments, as shown in FIG. 4A, the pattern 132*a* and the pattern 132*c* are spaced apart from each other in the first direction D1, and the pattern 132*b* and pattern 132*d* are spaced apart from each other in the first direction D1.

After that, an etching stop material layer 150 and a dielectric material layer 160 are formed on the substrate 100 in sequence. The etching stop material layer 150 may be conformally formed on the surface of the substrate 100 and the surface of the sacrificial gate structure 210. The dielectric material layer 160 may cover the sacrificial gate structure 210. The etching stop material layer 150 may include materials such as silicon nitrides. The dielectric material layer 160 may include a dielectric material such as a silicon oxide.

Then, referring to FIGS. 4A to 4C and FIGS. 5A to 5C, a planarization process such as a chemical mechanical polishing (CMP) process is performed on the dielectric material layer 160 and the etching stop material layer 150 to form the etching stop layer 152 and the dielectric layer 162.

After that, the sacrificial gate layer 114 in the sacrificial gate structure 210 is removed, and then metal materials are filled into a space formed by removing the sacrificial gate layer 114, so that a gate structure 310 including a metal gate 214 is formed after a planarization process (e.g., a CMP process) is performed on the metal materials to remove excess metal materials on the dielectric layer 160. The metal materials may include tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt) or other suitable materials.

Based on the above, in the method for forming the semiconductor device 10 in the above embodiments, the first silicide layer 140 and the second silicide layer 140 respectively embedded in the second regions of the source 120S and the drain 120D are each designed or formed to include the first portions 140*a* and the second portion 140*b* between the first portions 140*a* in which the lengths of the first portions 140*a* in the first direction D1 are smaller than the length of the second portion 140*b* in the first direction D1. As such, the resistances at edges of the semiconductor device 10 in the width direction (i.e., the second direction D2) perpendicular to the extension direction (i.e. the first direction D1) of the channel are increased, so that the threshold voltage of the semiconductor device 10 is mainly depended on the resistance at the center of the semiconductor device in the width direction, and thus the double-hump phenomenon is not occurred in the base current.

Hereinafter, the semiconductor structure 10 will be illustrated with reference to FIGS. 5A to 5C, but the method for forming the semiconductor structure 10 of the present invention is not limited thereto.

The semiconductor device 10 includes a substrate 100, a gate structure 310, a source 120S and a drain 120D, a plurality of blocking patterns 132*a*, 132*b*, 132*c* and 132*d*, and a first silicide layer 140 and a second silicide layer 140. The substrate 100 includes an isolation structure 102 defining an active region. The gate structure 310 is disposed on the active region of substrate 100. The source 120S and the drain 120D are respectively disposed in the substrate 100 at opposite sides of the gate structure 310 in the first direction D1. The blocking patterns 132*a*, 132*b*, 132*c* and 132*d* are respectively disposed on the source 120S and the drain 120D in which each of the source 120S and the drain 120D includes first regions (e.g., regions A1, A2, A3 and A4 shown in FIG. 3A) covered by the blocked patterns 132*a*, 132*b*, 132*c* and 132*d* and the second region (e.g., the region shown in FIG. 3A where the silicide layer 140 is formed) exposed by the blocked patterns 132*a*, 132*b*, 132*c* and 132*d*. The first silicide layer 140 and the second silicide layer 140 are respectively embedded in the second region of the source 120S and the second region of the drain 120D. Each of the first silicide layer 140 and the second silicide layer 140 includes a plurality of first portions 140*a* and a second portion 140*b* between the first portions 140*a*, and lengths of the first portions 140*a* in the first direction D1 are smaller than a length of the second portion 140*b* in the first direction D1.

In some embodiments, a pattern of the first silicide layer 140 on the source 120S and a pattern of the second silicide layer 140 on the drain 120D are mirror-symmetric in the first direction D1. In some embodiments, the first silicide layer 140 and the second silicide layer 140 are spaced apart from each other at the second portion 140*b* by a distance smaller than distances which the first silicide layer 140 and the second silicide layer 140 are spaced apart from each other at the first portions 140*a*. In some embodiments, each of the blocking pattern 132*a*, 132*b*, 132*c* and 132*d* covers the sidewalls of the gate structure 310. In some embodiments, the first silicide layer 140 is not formed in the first regions of the source 120S, and the second silicide layer 140 is not formed in the first regions of the drain 120D.

In summary, in the aforementioned semiconductor device and the method for forming the same, the first silicide layer and the second silicide layer respectively embedded in the second regions of the source and the drain are each designed or formed to include a plurality of first portions and a second portion between the first portions in which lengths of the first portions in the first direction are smaller than a length of the second portion in the first direction. As such, the resistances at edges of the semiconductor device in a width direction (i.e. the second direction) perpendicular to an extension direction of a channel (i.e. the first direction) are increased, so that the threshold voltage of the semiconductor device is mainly depended on the resistance at the center of the semiconductor device in the width direction, and thus the double-hump phenomenon is not occurred in the base current.

What is claimed is:

1. A method for forming a semiconductor device, comprising:

forming a gate stack structure on a substrate, wherein the substrate comprises an active region defined by an isolation structure, and the gate stack structure is disposed in the active region;

forming a source and a drain in the active region of the substrate, wherein the source and the drain are respectively formed at opposite sides of the gate stack structure in a first direction;

forming a blocking layer on the source and the drain, wherein each of the source and the drain comprises a plurality of first regions covered by the blocking layer and a second region exposed by the blocking layer; and performing a silicidation process to form a first silicide layer in the second region of the source and to form a second silicide layer in the second region of the drain, wherein each of the first silicide layer and the second silicide layer comprises a plurality of first portions and a second portion between the first portions, and lengths of the first portions in the first direction are less than a length of the second portion in the first direction.

2. The method of claim 1, wherein the first silicide layer and the second silicide layer are spaced apart from each other at the second portion by a distance smaller than distances which the first silicide layer and the second silicide layer are spaced apart from each other at the first portions.

3. The method of claim 1, wherein the blocking layer comprises a first blocking pattern and a second blocking pattern spaced apart from each other in a second direction crossing the first direction, and the first blocking pattern and the second blocking pattern cover a top surface and sidewalls of the gate stack structure.

4. The method of claim 3 further comprises:

removing portions of the first blocking pattern and the second blocking pattern on the top surface of the gate stack structure to form a plurality patterns spaced apart from each other and respectively covering the first regions of the source and the drain.

5. The method of claim 1, wherein the first silicide layer is not formed in the first regions of the source, and the second silicide layer is not formed in the first regions of the drain.

6. A semiconductor device, comprising:

a substrate comprising an isolation structure defining an active region;

a gate structure disposed on the active region of the substrate;

a source and a drain respectively disposed in the substrate at opposite sides of the gate structure in a first direction;

a plurality of blocking patterns respectively disposed on the source and the drain, wherein each of the source and the drain comprises a plurality of first regions covered by the blocking patterns and a second region exposed by the blocking patterns; and a first silicide layer and a second silicide layer respectively embedded in the second region of the source and the second region of the drain, wherein each of the first silicide layer and the second silicide layer comprises a plurality of first portions and a second portion between the first portions, and lengths of the first portions in the first direction are smaller than a length of the second portion in the first direction.

7. The semiconductor device of claim 6, wherein a pattern of the first silicide layer and a pattern of the second silicide layer are mirror-symmetric in the first direction.

8. The semiconductor device of claim 6, wherein the first silicide layer and the second silicide layer are spaced apart from each other at the second portion by a distance smaller than distances which the first silicide layer and the second silicide layer are spaced apart from each other at the first portions.

9. The semiconductor device of claim 6, wherein each of the blocking patterns covers sidewalls of the gate structure.

10. The semiconductor device of claim 6, wherein the first silicide layer is not formed in the first regions of the source, and the second silicide layer is not formed in the first regions of the drain.

* * * * *